United States Patent
Liu et al.

(10) Patent No.: US 8,274,313 B2
(45) Date of Patent: Sep. 25, 2012

(54) WAKE-UP CIRCUIT AND AN ON BOARD UNIT INCLUDING THE SAME, A FILTER, METHODS FOR FREQUENCY DETECTION AND FILTERING

(75) Inventors: Jiazhou Liu, Shanghai (CN); Dawei Guo, Shanghai (CN)

(73) Assignee: Beken Corporation, Shanghai (CN)

( * ) Notice: Subject to any disclaimer, the term of this patent is extended or adjusted under 35 U.S.C. 154(b) by 105 days.

(21) Appl. No.: 12/961,514

(22) Filed: Dec. 7, 2010

(65) Prior Publication Data

US 2012/0119799 A1   May 17, 2012

(30) Foreign Application Priority Data

Nov. 16, 2010   (CN) .......................... 2010 1 0545140

(51) Int. Cl.
*G01R 23/02* (2006.01)
*H03D 3/00* (2006.01)
*H03K 9/06* (2006.01)
(52) U.S. Cl. .............. 327/39; 327/40; 327/42
(58) Field of Classification Search ................ 327/39, 327/40, 42
See application file for complete search history.

(56) References Cited

U.S. PATENT DOCUMENTS 4,571,547 A * 2/1986 Day ............................ 327/69

\* cited by examiner

*Primary Examiner* — Lincoln Donovan
*Assistant Examiner* — John Poos
(74) *Attorney, Agent, or Firm* — Perkins Coie LLP; Aaron Winiger

(57) ABSTRACT

A wake-up circuit, comprising: a control signal generation circuit comprising: a pulse generator configured to receive a digital signal and generate a pulse sequence signal with a frequency thereof; a first comparison circuit and a second comparison circuit both coupled to the pulse generator and configured to receive the pulse sequence signal; the first comparison circuit is configured to compare the frequency of the pulse sequence signal with a first threshold frequency and generate a first control signal; the second comparison circuit is configured to compare the frequency of the pulse sequence signal with a second threshold frequency and generate a second control signal; the frequency detector further comprises: an indication generation circuit configured to generate a wake-up indication if the frequency of the pulse sequence signal falls within a frequency range defined by the first and second threshold frequencies.

16 Claims, 8 Drawing Sheets

US 8,274,313 B2

WAKE-UP CIRCUIT AND AN ON BOARD UNIT INCLUDING THE SAME, A FILTER, METHODS FOR FREQUENCY DETECTION AND FILTERING

CLAIM OF PRIORITY

This application claims priority to Chinese Application number 201010545140.9 entitled "A WAKE-UP CIRCUIT AND AN ON BOARD UNIT INCLUDING THE SAME, A FILTER, METHODS FOR FREQUENCY DETECTION AND FILTERING", filed on Nov. 16, 2010, which is incorporated herein by reference.

TECHNICAL FIELD

The present application relates to frequency-based digital signal processing, particularly to frequency detection and frequency-selective filtering.

BACKGROUND OF THE INVENTION

Electronic Toll Collection (ETC) systems enable drivers to pay road tolls without stopping their vehicles. An ETC system is especially useful for highways, bridges and tunnels with heavy traffic.

A Road Side Unit (RSU) broadcasts wireless signals at a certain frequency, such as 14 KHz square waves modulated by 5.83 GHz or 5.84 GHz carrier waves according to a standard (e.g., national standard of China).

An On Board Unit (OBU) uses a wake-up circuit, which will wake up the primary circuit in the OBU when one or more preset conditions are met. However, power consumption of existing wake-up circuits is too high, which is a main factor in restricting extension and application thereof.

Therefore, it is desirable to develop a new wake-up circuit with lower power consumption that can be used in OBUs.

BRIEF SUMMARY OF THE INVENTION

According to one embodiment of the present invention, there is provided a wake-up circuit, comprising:
a control signal generation circuit, comprising:
a pulse generator configured to receive a digital signal and generate a pulse sequence signal with a frequency of the digital signal; a first comparison circuit and a second comparison circuit both coupled to an output end of the pulse generator and configured to receive the pulse sequence signal; the first comparison circuit is configured to compare the frequency of the pulse sequence signal with a first threshold frequency and generate a first control signal based on the comparison; the second comparison circuit is configured to compare the frequency of the pulse sequence signal with a second threshold frequency and generate a second control signal based on the comparison; and
an indication generation circuit configured to use the first control signal and the second control signal to generate a wake-up indication when the frequency of the pulse sequence signal falls within a frequency range defined by the first and second threshold frequencies.

According to another embodiment of the invention, there is provided a filter for digital signals, comprising:
a control signal generation circuit comprising:
a pulse generator configured to receive a digital signal and generate a pulse sequence signal with a frequency of the digital signal; a first comparison circuit and a second comparison circuit both coupled to an output end of the pulse generator and configured to receive the pulse sequence signal; the first comparison circuit is configured to compare the frequency of the pulse sequence signal with a first threshold frequency and generate a first control signal based on the comparison; the second comparison circuit is configured to compare the frequency of the pulse sequence signal with a second threshold frequency and generate a second control signal based on the comparison; and
a regeneration circuit configured to use the first control signal and the second control signal to generate an output signal with the frequency of the digital signal if the frequency of the digital signal falls within a frequency range defined by the first and second threshold frequencies.

According to another embodiment of the invention, there is provided a method in a wake-up circuit, comprising:
generating a pulse sequence signal with a frequency of a digital signal;
comparing the frequency of the pulse sequence signal with a first threshold frequency, and generating a first control signal based on the comparison;
comparing the frequency of the pulse sequence signal with a second threshold frequency, and generating a second control signal based on the comparison;
generating, using the first control signal and the second control signal, a wake-up indication if the frequency of the pulse sequence signal falls within a frequency range defined by the first and second threshold frequencies.

According to another embodiment of the invention, there is provided a method, comprising:
generating a pulse sequence signal with a frequency of a digital signal;
comparing the frequency of the pulse sequence signal with a first threshold frequency to generate a first control signal;
comparing the frequency of the pulse sequence signal with a second threshold frequency to generate a second control signal;
generating, using the first control signal and the second control signal, an output signal with the frequency of the pulse sequence signal if the frequency of the pulse sequence signal falls within a frequency range defined by the first and second threshold frequencies.

According to still another embodiment of the invention, there is provided an on board unit of an electronic toll collection system, comprising:
a preprocessing circuit configured to preprocess an received signal, so as to obtain an original digital signal;
a wake-up circuit connected to the preprocessing circuit and configured to receive the obtained original digital signal;
a primary circuit connected to the wake-up circuit;
wherein the wake-up circuit comprises:
a pulse generator configured to receive a digital signal and generate a pulse sequence signal with a frequency of the digital signal; a first comparison circuit and a second comparison circuit both coupled to an output end of the pulse generator and configured to receive the pulse sequence signal; the first comparison circuit is configured to compare the frequency of the pulse sequence signal with a first threshold frequency and generate a first control signal based on comparison; the second comparison circuit is configured to compare the frequency of the pulse sequence signal with a second threshold frequency and generate a second control signal based on comparison; and an indication generation circuit configured to use the first and second control signal to generate a wake-up indication to awake the primary circuit if the frequency of the pulse sequence signal falls within a frequency range defined by the first and second threshold frequencies.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-know structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Without loss of generality, reference will be made to the illustrative examples by taking the application in an ETC system as example. Those of ordinary skill in the art understand that this is only to describe the invention clearly and adequately, rather than limit the scope of the invention, which is defined by the appended claims.

Figure 1:
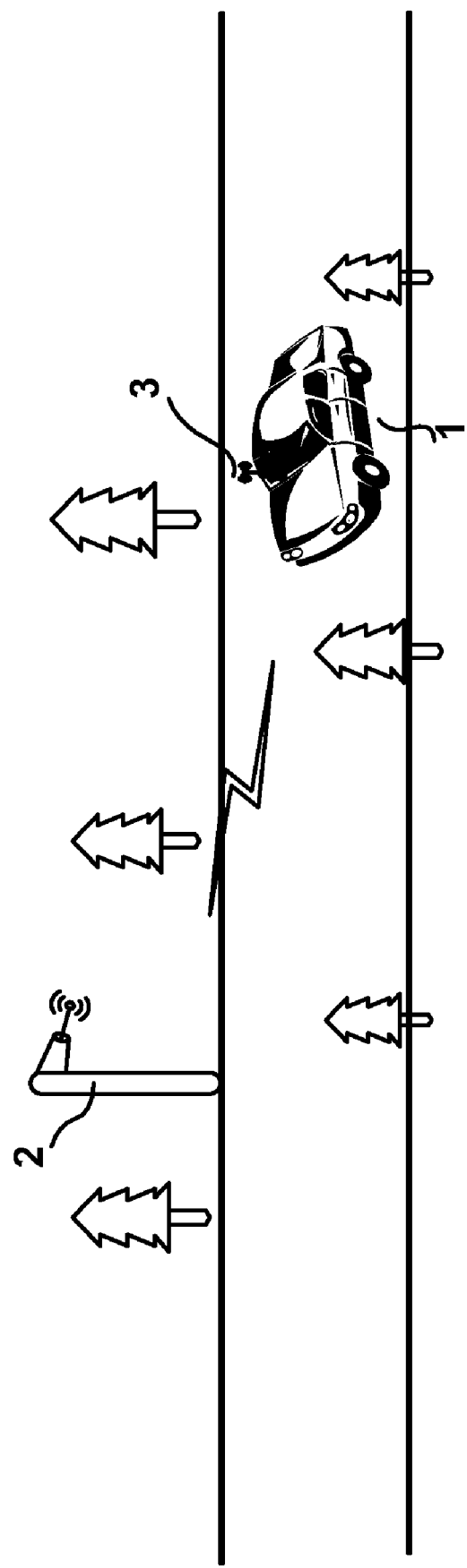
FIG. 1 is a drawing illustrating an ETC system in use.
Figure 2:
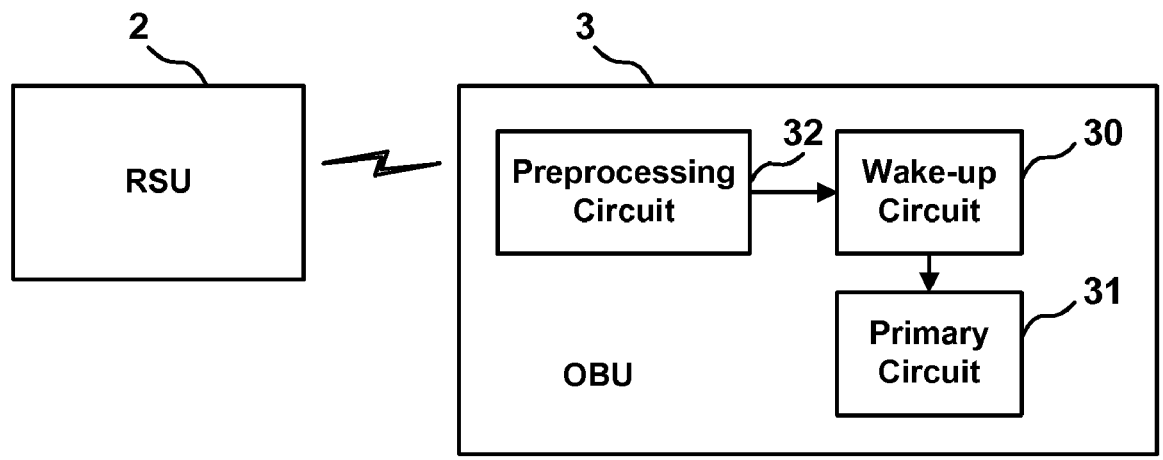
FIG. 2 is a block diagram illustrating the ETC system shown in FIG. 1.

A brief description of an ETC system according to an embodiment of the invention is set forth below with reference to FIGS. 1 and 2. As shown in FIG. 1, the ETC system generally comprises a Road Side Unit (RSU) 2 and an On Board Unit (OBU) 3. In practice, the OBU 3 is generally installed on the windshield or at other suitable place of a vehicle 1. In FIG. 2, the OBU 3 includes a wake-up circuit 30, a primary circuit 31 and a preprocessing circuit 32.

The preprocessing circuit 32 is configured to demodulate and decode a received wireless signal and obtain an original digital signal (hereinafter referred to as digital signal). The wake-up circuit 30 is configured to detect the frequency of the digital signal. Once it is found that the frequency falls within a frequency range, such as 10 KHz to 20 KHz, the wake-up circuit 30 recognizes that a wake-up signal has been received, and then awakes the primary circuit 31. The primary circuit 31 then establishes a connection with the RSU 2 to fulfill a payment. In this way, the primary circuit 31 will remain powered down until awakened in order to conserve power. Reference will be made in further detail to the ETC system below.

FIG. 2 is a block diagram illustrating the ETC system shown in FIG. 1. The RSU 2 generates and broadcasts a wake-up signal after coding and modulation. The broadcasted signal will be received by the OBU 3 with a dedicated antenna or an antenna shared with other communication devices of the vehicle 1. After demodulation, decoding performed by the preprocessing circuit 32, the original digital signal, e.g., the original wake-up signal taking a form of a square wave with a frequency of 14 KHz, will be provided by the preprocessing circuit 32 to the wake-up circuit 30. If the obtained digital signal has a frequency within a frequency range, the wake-up circuit 30 will send the primary circuit 31 a wake-up instruction.

Figure 3:
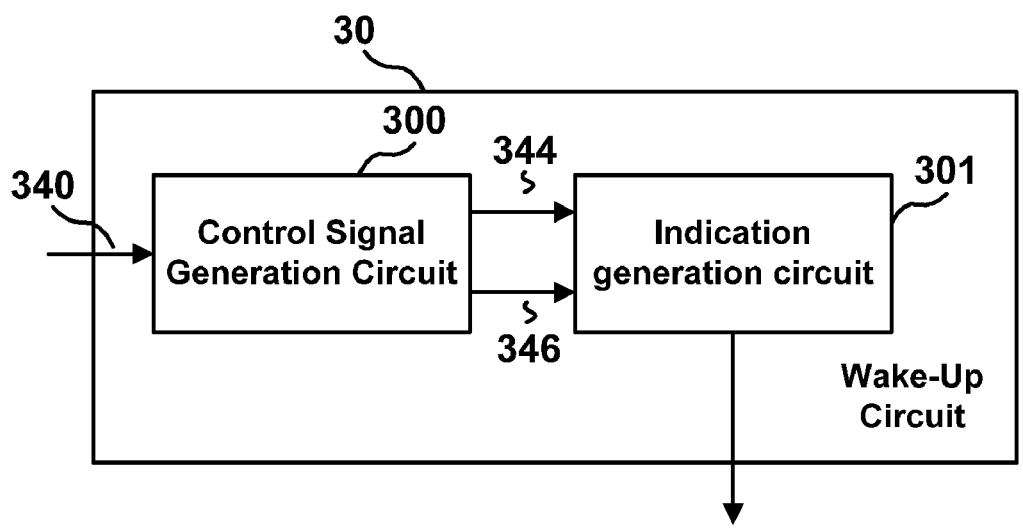
FIG. 3 is a block diagram illustrating a wake-up circuit shown in FIG. 2.

FIG. 3 is a block diagram illustrating the wake-up circuit 30 shown in FIG. 2. The wake-up circuit 30 comprises a control signal generation circuit 300 and an indication generation circuit 301. The control signal generation circuit 300 is configured to receive a digital signal (i.e. original digital signal) 340 obtained by the preprocessing circuit 32, generate a first control signal 344 and a second control signal 346 describing the relationship between (a) the frequency of the digital signal, (b) a first and a second threshold frequencies. The indication generation circuit 301 receives the first and second control signals from the control signal generation circuit 300, and provides the wake-up instruction if the frequency of the digital signal falls within a frequency range defined by the first and second threshold frequencies.

Figure 4:
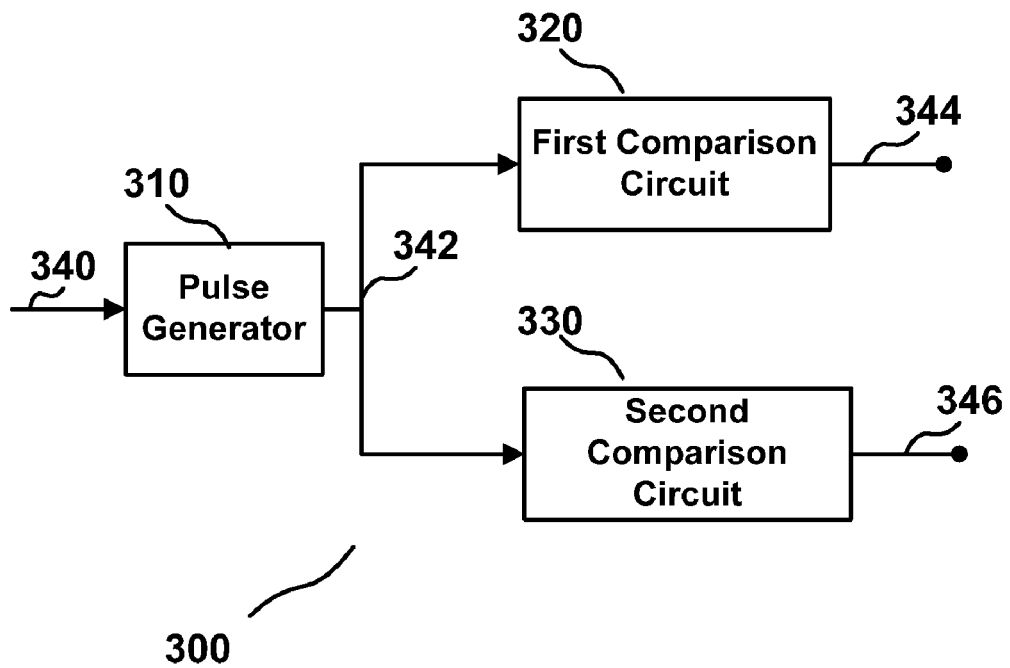
FIG. 4 is a block diagram illustrating a control signal generation circuit according to one embodiment of the invention.

FIG. 4 is a block diagram of the control signal generation circuit 300 in FIG. 3 according to an embodiment of the present invention. The circuit 300 includes a pulse generator 310, a first comparison circuit 320 and a second comparison circuit 330.

The pulse generator 310 receives the digital signal 340 obtained by the preprocessing circuit 32, and generates a pulse sequence signal 342 sharing the same frequency with the digital signal 340.

The first comparison circuit 320 and the second comparison circuit 330 receive the pulse sequence signal 342 respectively. The first comparison circuit 320 then compares the frequency of the pulse sequence signal 342, which is referred to as F, with a first threshold frequency such as 20 KHz. The first comparison circuit 320 generates a first control signal 344 based on the comparison. The second comparison circuit 330 compares F with a second threshold frequency such as 10 KHz, and generates a second control signal 346 based on the comparison.

Figure 5:
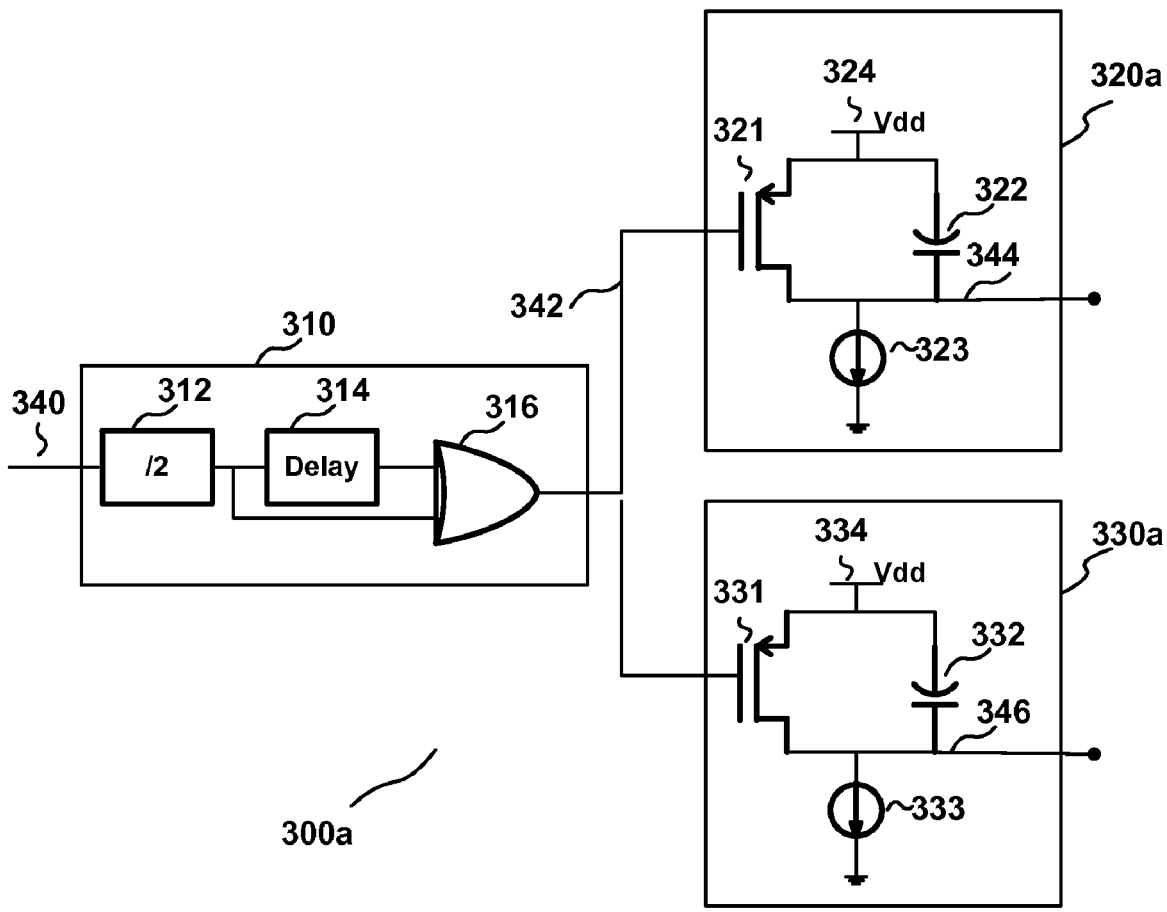
FIG. 5 is a drawing illustrating the detailed structure of a control signal generation circuit according to one embodiment of the invention.

FIG. 5 is a drawing illustrating a detailed structure of the control signal generation circuit 300a. The pulse generator 310 includes a frequency-halving module 312, a delay module 314 and an XOR gate 316, which are jointly configured to generate the pulse sequence signal 342. An output end of the XOR gate 316 is taken as an output end of the pulse generator 310. According to an embodiment, the frequency of the pulse sequence signal 342 is 14 KHz, which means the received signal is a wake-up signal.

A frequency of the frequency-halved signal outputted by the frequency-halving module 312 is half the frequency of the digital signal 340. According to an embodiment of the invention, a duty ratio of the frequency-halved signal is 50%, i.e., the duration of digital 1 takes 50% of the total time.

Figure 12:
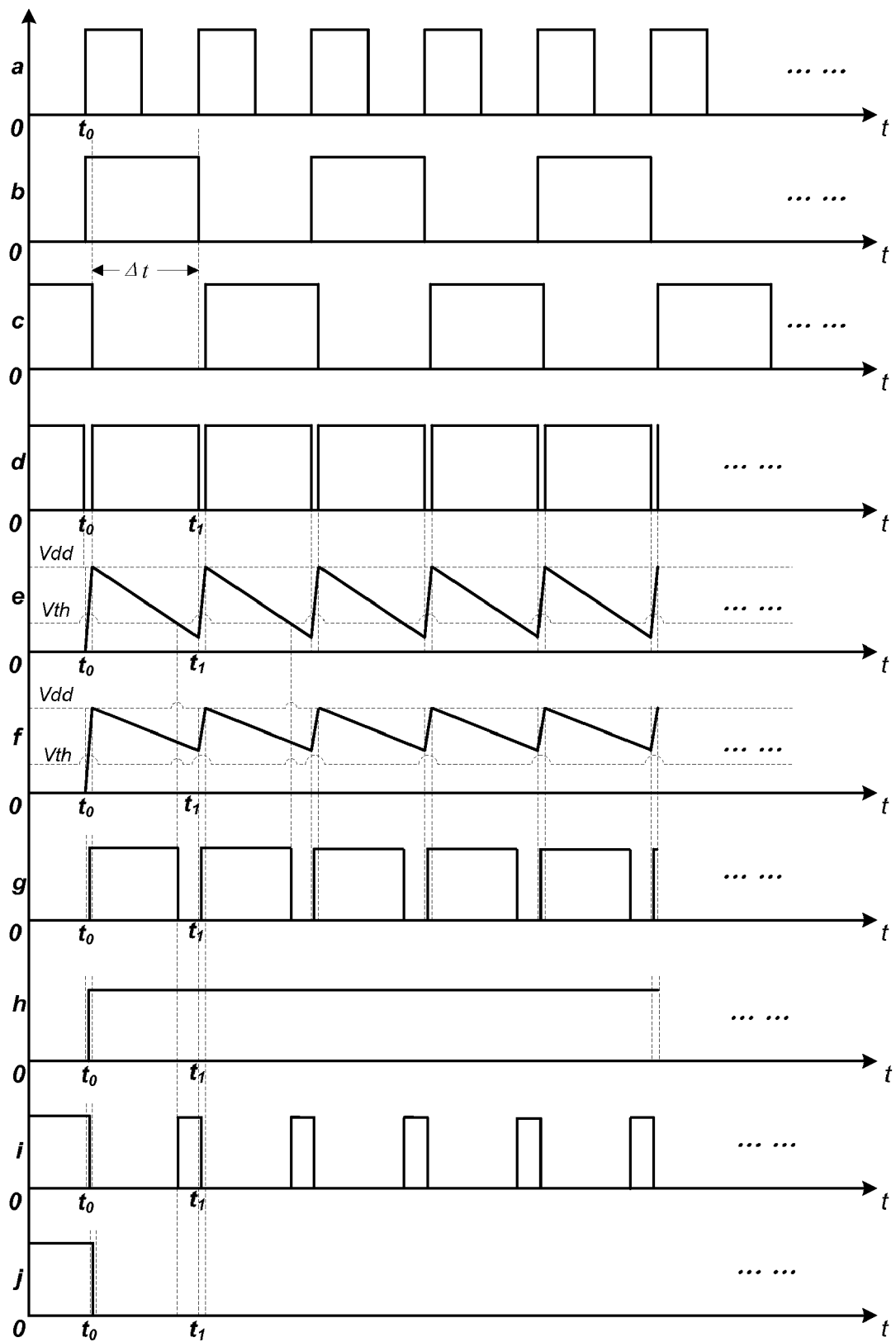
FIG. 12 is a drawing illustrating the signal flow according to an embodiment of the invention.

One example of the output and input of the frequency-halving module 312 is shown in FIG. 12. It can be seen that, the rising edges of the original digital signal 340 (the wave shape of which is marked as a in FIG. 12) become rising or falling edges of the frequency-halved signal marked as b. Those of ordinary skill in the art understand that, though the digital signal 340 has a duty ratio of 50% in FIG. 12, the present invention does not intend to limit the duty ratio of the digital signal.

In FIG. 5, the frequency-halved signal b is provided to the delay module 314 by the frequency-halving module 312, wherein a delay Δt is imposed to signal b to generate a delayed signal c as shown in FIG. 12. Signals b and c enter the XOR gate 316, which will generate a pulse sequence signal 342 marked as d in FIG. 12. At each rising edge of the signal 340 (marked as a), there is a negative pulse of a short duration in signal 342 (marked as d).

According to the embodiment shown in FIG. 5, the first comparison circuit 320a includes a first P-type MOSFET 321 (MOS 321), a first capacitor 322 (capacitor 322) and a first load 323. The first load 323 is formed as a current source, which is referred to as current source 323. The gate of the MOS 321 is connected to the output end of the XOR gate 316 to receive the pulse sequence signal 342, a drain of the MOS 321 is connected to a negative terminal of the capacitor 322 to form a first common terminal 344, where the signal has a wave shape marked as e in FIG. 12. A source of the MOS 321 is connected to a positive terminal of capacitor 322 to form a second common terminal which is connected to a positive voltage power source, such as drain voltage (Vdd) 324, i.e., digital 1. The first common terminal 344 is further connected to one end of the current source 323. The other end of the current source 323 is grounded.

The second comparison circuit 330a includes a second P-type MOSFET 331 (MOS 331), a second capacitor 332 (capacitor 332) and a second load 333. The second load 333 is formed as a current source, which is referred to as current source 333. A gate of the MOS 331 is connected to an output end of the XOR gate 316 to receive the pulse sequence signal 342, a drain of the MOS 331 is connected to a negative terminal of the capacitor 332 to form a third common terminal 346, where the signal has a wave shape marked as f in FIG. 12. A source of MOS 331 is connected to a positive terminal of capacitor 332 to form a fourth common terminal which is connected to a positive voltage power source, such as Vdd 334, i.e., digital 1. The third common terminal 346 is connected to one end of the current source 333. The other end of the current source 333 is grounded.

An RC time constant of capacitor 322 under the action of current source 323 is reciprocal of a first threshold frequency, e.g., 20 KHz, similarly, an RC time constant of the capacitor 332 under the action of current source 333 is reciprocal of a second threshold frequency, e.g., 10 KHz. Hence, capacitor 322 charges faster than capacitor 332.

Referring to FIG. 5, and FIG. 12, at time 0, the potential at the positive terminal of capacitor 322 is Vdd, and the potential at the negative terminal of capacitor 322 is 0. Therefore, the initial voltage between the two terminals of capacitor 322 is Vdd. At time $t_0$, a rising edge of the digital signal 340 (marked as a) comes, the XOR gate 316 generates a negative pulse of a short duration. While the source of MOS 321 is connected to Vdd (digital 1), the potential at the gate of MOS 321 suddenly decreases to digital 0, the voltage between the source and gate exceeds a cut-in voltage of MOS 321. Therefore, the capacitor 322 and MOS 321 form a loop in which capacitor 322 discharges instantaneously so that the two terminals of capacitor 322 have the same potential, i.e. Vdd. The discharging process is marked as e in FIG. 12, which takes the form of a precipitous curve starting at $t_0$. Those of ordinary skill in the art will understand that the capacitor 322 can also finish discharging before the end of the negative pulse. In the present embodiment, the current of the current sources are quite weak, maybe less than 1 μA, whilst the discharging current of the capacitors are relatively strong, e.g., 100 μA. Thus, the discharging speeds of capacitor 322, 332 are hardly affected by the respective current sources 323, 333.

After the negative pulse, the potential at the gate of MOS 321 will return to Vdd (digital 1), MOS 321 is cut off. Due to the existence of current source 323, a consistent current flowing from the negative terminal (first common terminal 344) of capacitor 322 to the ground appears. The current source 323 takes positive charge from the negative terminal of capacitor 322 where negative charge accumulates. The voltage between the two terminals of capacitor 322 becomes larger and larger, i.e., the potential of the negative terminal of capacitor 322 goes down from Vdd while the capacitor 322 is recharging.

If the recharging is sufficient, charge q accumulating at the capacitor 322 will satisfy an equation below:

$$q=CV \qquad (1)$$

where C is the capacitance of capacitor 322, V is a voltage between the two terminals of capacitor 322.

Because of the periodicity of the pulse sequence signal 342, the next negative pulse will come at $t_1$, the source-gate voltage of MOS 321 exceeds the cut-off voltage again, capacitor 322 discharges again until its positive and negative terminals share the same potential, i.e., Vdd.

It can be seen that, when the pulse sequence signal 342 takes a shape as marked as d, the signal at the output end 344 of the first comparison circuit 320 will take the shape e.

The second comparison circuit 330 has similar configuration to the first comparison circuit 320, so the capacitor 330 discharges/recharges in a similar way to capacitor 320's. However, since these two capacitors have different RC time constants, they will recharge at different speeds, referring to FIG. 12 in which capacitor 322 recharges faster.

With the combination of the elements in FIG. 5, the circuit 300a obtains, based on the digital signal 340, the first control signal 344, and the second control signal 346. The potential of each control signal at $t_1$ depends on the frequency of the pulse sequence signal 342, see FIG. 12, the larger the frequency is, the less time for the capacitors to recharge, the higher the potential at the first and third common terminals at $t_1$.

The capacitors discharge at high speed, while the loads recharge the capacitors relatively slowly. Therefore, according to one embodiment of the invention, each negative pulse in the pulse sequence signal 342 has a duration as short as possible, to leave the remaining time for recharging. If low level lasts too long in the pulse sequence signal 342, the precision of the whole circuit will be seriously reduced.

Figure 6:
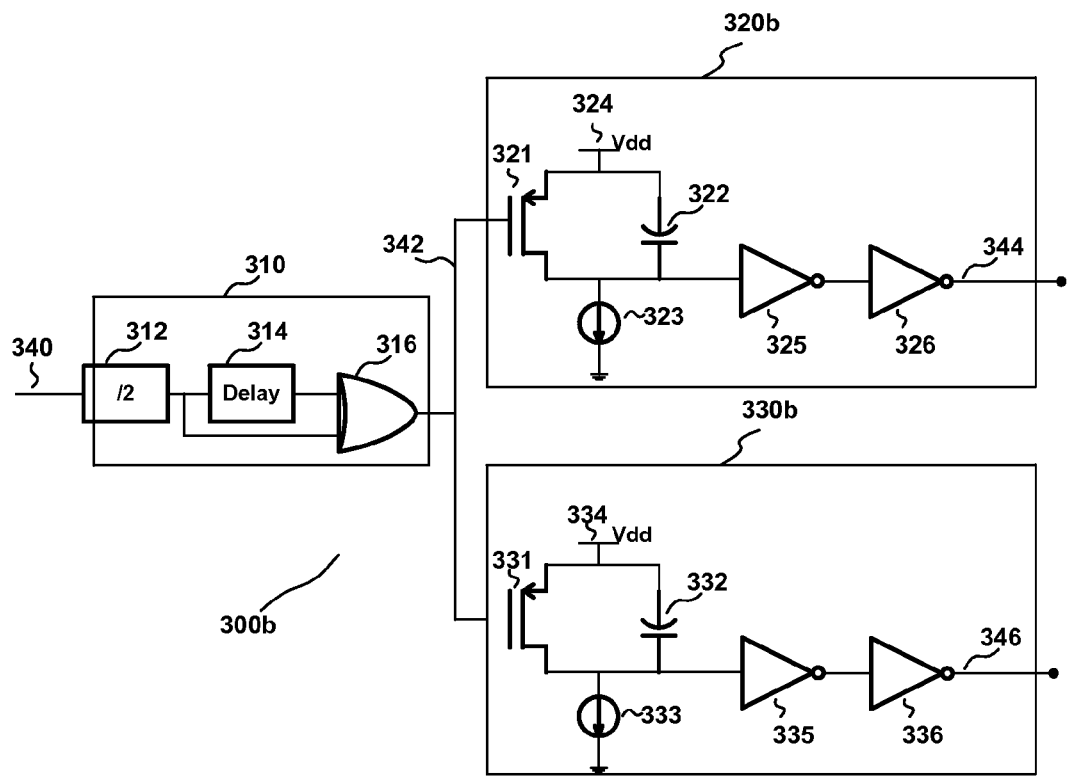
FIG. 6 is a drawing illustrating the detailed structure of a control signal generation circuit according to another embodiment of the invention.

The embodiment shown in FIG. 5 has a variant illustrated in FIG. 6. The first common terminal formed by capacitor 322 and current source 323 is connected to an input end of a first inverter 325 (inverter 325), rather than being taken as the output end of the first comparison circuit 320. The output end of inverter 325 is connected to an input end of a second inverter 326 (inverter 326), the output end of the inverter 326 is taken as the output end of the first comparison circuit 320 for instead. Similarly, in the second comparison circuit 330, the third common terminal formed by the capacitor 332 and the current source 333 is connected to an input end of a third inverter 335 (inverter 335), the output end of the inverter 335 is connected to an input end of a fourth inverter 336 (inverter 336), the output end of the inverter 336 is taken as the output end of the second comparison circuit 330 for instead.

Inverters 325, 326, 335 and 336 are provided to convert transition of the first and second control signals outputted respectively by the first comparison circuit 320 and the second comparison circuit 330 (i.e. the signals marked as e, f in FIG. 12) from a gradual decrease to a sharp decrease. Reference will be made to these inverters in further detail below.

An inverter has a turnover voltage. If the signal inputted to an inverter is lower than its turnover voltage, the input is actually digital 0 for that inverter. Therefore, the output of the inverter will be digital 1. When the input increases and reaches the turnover voltage, the input will be digital 1 again and the inverter outputs digital 0. On the contrary, if the input fed to an inverter is initially digital 1 and then decreases, it will become digital 0 when the turnover voltage has been reached and the inverter will output digital 1 accordingly.

Referring to FIG. 12, there are horizontal dotted lines in respective frames of axes for signals marked as e and f. The dotted lines are marked as Vth denoting the turnover voltages of the inverters 325 and 335. It can be seen that when the frequency of the pulse sequence signal 342 (marked as d) is 14 KHz, capacitor 322 has sufficient time for recharging, so that the potential at the first common terminal is pulled down sufficiently to be lower than the turnover voltage of inverter 325. Therefore, for inverter 325, the input is equivalent to signal g. When the gradually changing potential at the first common terminal reaches the turnover voltage, the input of inverter 325 will turn to 0 from 1, until the next negative pulse in signal 342 comes. Based on the input shown as signal g, the output provided by inverter 325 will be signal i, inverter 326 then converts signal i back to signal g. Therefore, the first control signal 344 takes a similar wave shape to the one of signal g, with a certain phase shift caused by the buffer effect of inverters 325 and 326. Since the frequency of the digital signal 340 is higher than the second threshold frequency (10 KHz), when the next negative pulse of the pulse sequence signal 342 comes, the potential at the third common terminal marked as f in FIG. 12 has not reached the turnover voltage of the inverter 335. Hence, the input fed to inverter 335 can be consider as constant 1, as marked as h in FIG. 12. The output of inverter 335 is hence constant 0, see signal j. The output of inverter 336 will be constant 1, see signal h.

In another embodiment, the digital signal 340 has a frequency exceeding 20 KHz, consequently, the next negative pulse will come before the potential at the first common terminal reaches the turnover voltage of inverter 325. The capacitor 322 discharges again. Thus, the input fed to the inverter 325 is always Vdd, hence the output of the first comparison circuit 320, i.e. the first control signal 324, is always digital 1. Meanwhile, the second control signal 326 is also constant 1.

In still another embodiment of the present invention, the digital signal 340 has a frequency lower than 10 KHz, the first control signal 324 outputted by the first comparison circuit 320 will be similar to the one marked as e in FIG. 12. In the second comparison circuit 330, the discharge of the capacitor 332 will pull the potential at the third common terminal to be lower than the turnover voltage of inverter 335, thus, the second control signal 346 outputted by the inverter 336 will take the form of a square wave.

The two control signals outputted by the inverters 326 and 336 are digital and can be used directly to control another circuit, such as an indication generation circuit 301d or a regeneration circuit 302 which will be described in detail below. Those of ordinary skill in the art will understand that the inverters 325, 326, 335 and 336 are optional, like other elements, because: when the indication generation circuit 301d or regeneration circuit 302 includes digital elements with a turnover voltage, acceptable performance can be achieved without any inverter as long as the capacitors 322, 332 and loads in the first and second comparison circuits are properly engineered to match with the digital elements in the indication generation circuit 301d or regeneration circuit 302.

Figure 7:
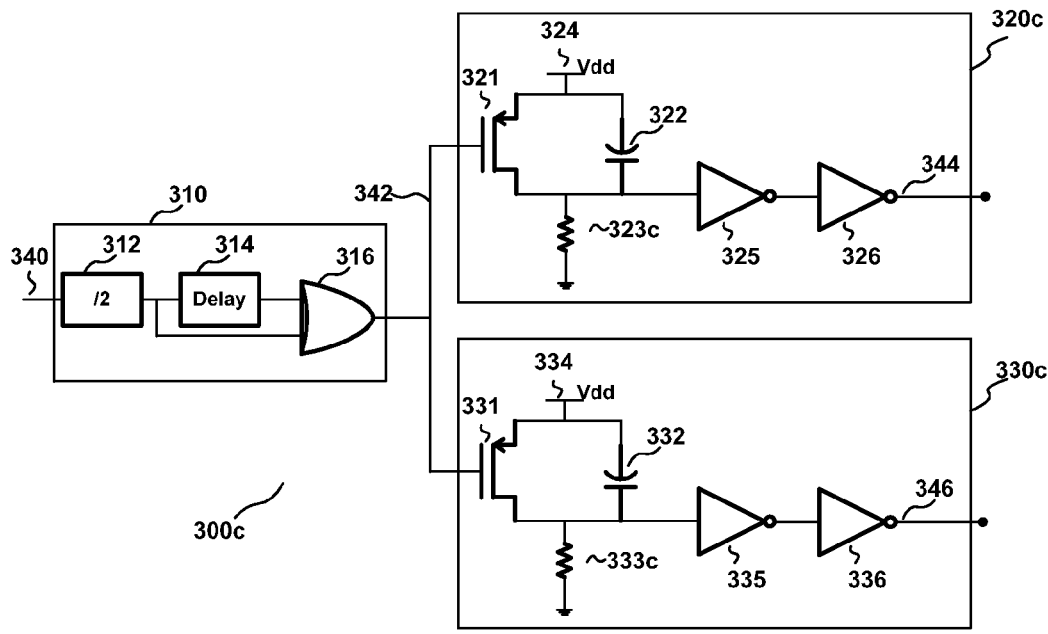
FIG. 7 is a drawing illustrating the detailed structure of a control signal generation circuit according to another embodiment of the invention.

Another variant of the embodiment in FIG. 5 is shown in FIG. 7. The current sources are replaced by resistors marked as 323c and 333c. Taking capacitor 322 and resistor 323 as an example, the recharging process of capacitor 322 under the action of resistor 323c can be: at $t_1$, MOS 321 is cut off. The potential at the first common terminal is Vdd, the voltage between the first common terminal and the ground is also Vdd. Thus, there will be current flowing from the negative terminal of capacitor 322 to the ground, taking positive charge away, which results in negative charge accumulating at the negative terminal of capacitor 322.

Figure 8:
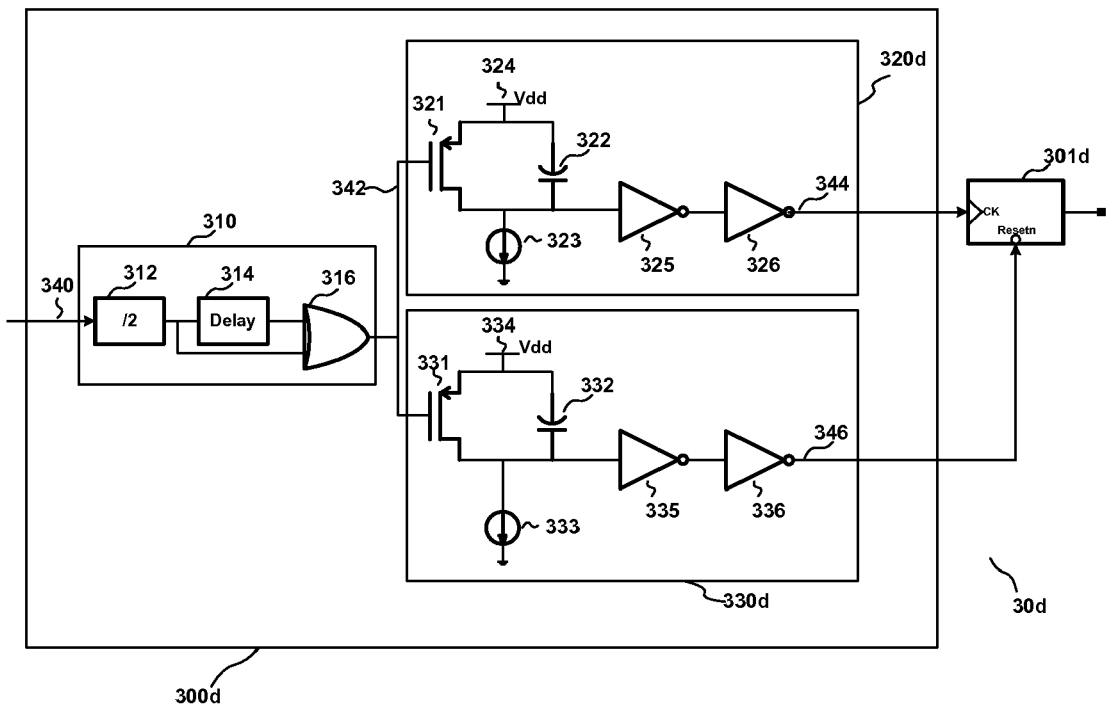
FIG. 8 is a drawing illustrating the detailed structure of a wake-up circuit according to an embodiment of the invention.

The above description is directed to the generation of the first control signal and the second control signal based on the inputted digital signal 340. There are various applications of the control signal, one of which is shown in FIG. 8 which is a drawing illustrating the detailed structure of a wake-up circuit 30d according to an embodiment of the invention. Besides the control signal generation circuit 300d, the wake-up circuit 30d further comprises a clock counter 301d.

To be specific, the clock counter 301 receives the first control signal 344 with a clock signal input end (CK) and receives the second control signal 346 with a reset end.

In case the frequency of the digital signal 340 is between 10 KHz and 20 KHz, the input at the clock signal input end of the clock counter 301 will be a clock signal, while the input at the reset end will be a DC signal, e.g., constant digital 1. Consequently, the clock counter 301 counts regularly, and outputs an indication when a certain number (e.g., 5) of rising edges have arrived. The indication is, for example, constant digital 1, indicating that the inputted digital signal 340 has a desirable frequency, which is lower than the first threshold frequency (20 KHz) and higher than the second threshold frequency (10 KHz).

If the input at the clock signal input end of the clock counter 301 is constant digital 1, which means the frequency of the digital signal 340 is higher than the first threshold frequency (20 KHz), the clock counter 301 will not count since there is no rising edge at its clock signal input end. The output of the clock counter 301 will be, for example, constant digital 0, indicating that the frequency of the digital signal 340 is undesirable.

If the input at the reset end of the clock counter 301 is a clock signal, which means that the digital signal 340 has a frequency lower than the second threshold frequency (10 KHz), the output of the clock counter 301 will be, for example, constant digital 0, indicating that the frequency of the digital signal 340 is undesirable.

When the frequency detector 30*d* in FIG. 8 is used as a wake-up circuit in an ETC system, the primary circuit 31 being connected to the output end of the clock counter 301 can be configured in advance, so that the primary circuit 31 will be powered down until a particular input is received from the clock counter 301, such as constant digital 1.

Alternatively, the aforesaid circuit 300 can be used for frequency-selective filtering of a digital signal. See FIG. 9 in which a regeneration circuit 302 includes a first D-type flip-flop 351 (D-type flip-flop 351), a second D-type flip-flop 352 (D-type flip-flop 352) and an AND gate 353. An output end 344 of the first comparison circuit 320 is connected to an clock signal input ends (CK) of the two D-type flip-flops and one input end of the AND gate. An D input end (D) of the D-type flip-flop 351 is connected to Vdd. An output end (Q port) of the D-type flip-flop 351 is connected to an D input end of the D-type flip-flop 352. The output end 346 of the second comparison circuit 330 is connected to the reset ends of the two D-type flip-flops. A Q port of D-type flip-flop 352 is connected to the other input end of the AND gate 353. An output end of the AND gate 353 is taken as an output end of the regeneration circuit 302, i.e., the output end of this filter.

The D-type flip-flops 351 and 352 act only at rising edges. For either of D-type flip-flops 351 and 352: (1) when an input at the reset end is 0, the Q port will output 0, (2) when an input at reset end is 1, the output from Q port will synchronize with the input at the D input end. That's to say, once a rising edge arrives, the Q port will output what is inputted at D input end.

In case that the digital signal 340 has a frequency higher than the first threshold frequency (e.g., 20 KHz), the input at the clock signal input ends and reset ends of the two D-type flip-flops will be constant 1, which makes the output of the output of the AND gate 353 constant 0, so that the digital signal with frequency exceeding 20 KHz is filtered out.

When the frequency of the digital signal 340 is between the first and second threshold frequencies, e.g., 15 KHz, the output of the second comparison circuit 330 (i.e., second control signal) will be constant 1, while the clock signal input ends of the two D-type flip-flops are fed with clock signal with alternate 0 and 1. Therefore, the D-type flip-flop 351 transmits the Vdd connected to its D input end to its Q port, so the output of the AND gate 353 will be the same as the first control signal 344 which sharing the frequency of the digital signal 340. By engineering the capacitors and the loads, the duty ratio of the signal outputted by the AND gate 353 can be controlled, and can be closer to the duty ratio of the digital signal 340 than what is shown in FIG. 12.

If the frequency of the digital signal 340 is lower than 10 KHz, each of the first control signal and the second control signal will alternate between 0 and 1. Therefore, even though the D-type flip-flop 351 can transmit Vdd to the D input end of the D-type flip-flop 352, D-type flip-flop 352 is still being reset again and again by signal 346. Therefore, Vdd can never be transmitted to the Q port of the D-type flip-flop 352, that's to say, D-type flip-flop 352 will always input 0. Consequently, the output of the AND gate 353 will be constant 0. Thus, inputted digital signal with a frequency lower than the second threshold frequency (10 KHz) is filtered out.

Alternatively, RS-type flip-flops can be adopted instead of D-type flip-flops.

Figure 9:
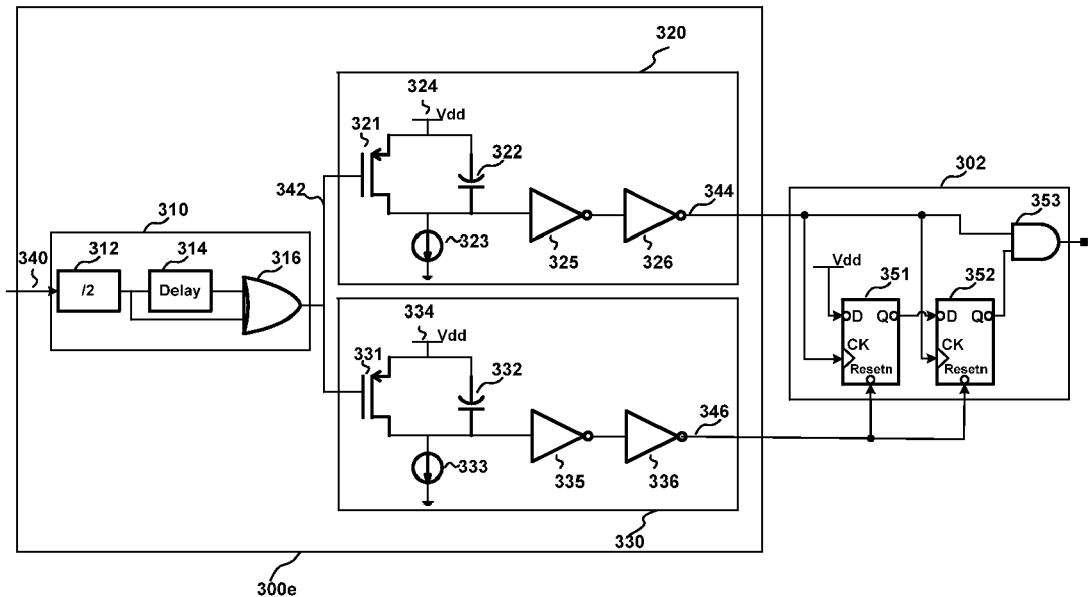
FIG. 9 is a drawing illustrating of the detailed structure of a filter for digital signals according to an embodiment of the invention.

Alternatively, a wake-up circuit can be formed by coupling a clock counter shown in FIG. 8 to the filter in FIG. 9.

Considering the mismatching between the capacitors and loads, according to at least one embodiment of the invention, the inaccuracy is no more than 1%, which is tolerable in many cases.

Referring to any of FIGS. 5-9, the first comparison circuit 320 is for the limitation of high-frequency signal, i.e.: (1) the first comparison circuit 320 will output DC signal (e.g., constant digital 1) when the frequency of the digital signal 340 exceeds the first threshold frequency; (2) the first comparison circuit 320 will output a clock signal sharing the same frequency with the digital signal 340 when the frequency is lower than the first threshold frequency. The second comparison circuit 330 is for the limitation of low-frequency signal, i.e.: (1) the second comparison circuit 330 will output constant 1 when the frequency of the digital signal is higher then the second threshold frequency, and will output a clock signal sharing the same frequency with the digital signal when the frequency is lower than the second threshold frequency.

Figure 10:
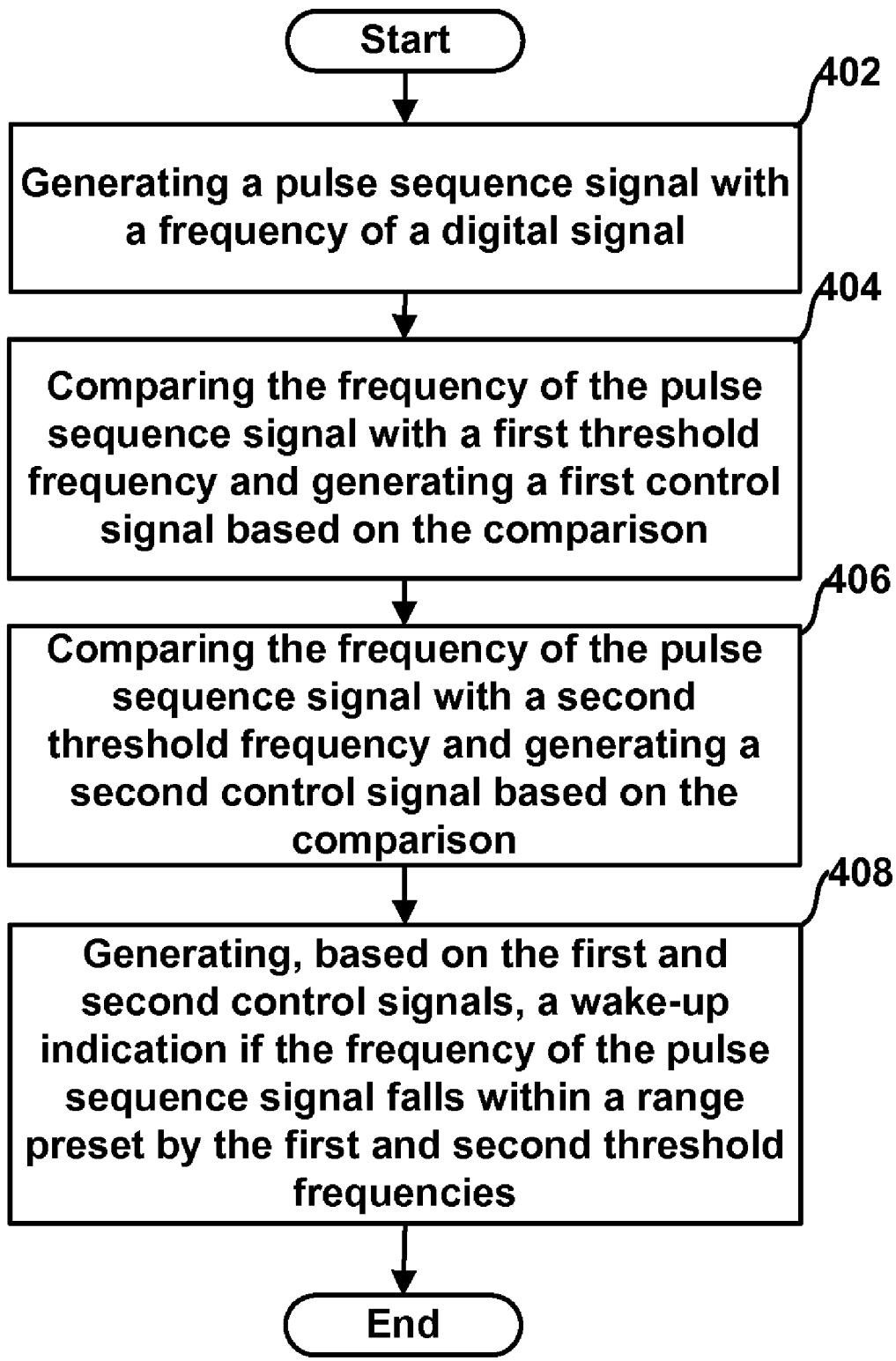
FIG. 10 is a flow chart of a method according to an embodiment of the invention.

FIG. 10 is a flow chart of a method 400 for frequency detection according to one embodiment of the invention. In step 402, a pulse sequence signal with the frequency of the digital signal is generated, refer to the process performed by the pulse generator 310 above. In step 404, the frequency of the pulse sequence signal is compared with a first threshold frequency, a first control signal is generated based on the comparison, refer to the process performed by the first comparison circuit 320. In step 406, the frequency of the pulse sequence signal is compared with a second threshold frequency, a second control signal is generated based on the comparison, refer to the process performed by the second comparison circuit 330. In step 408, using the first control signal and the second control signal, a wake-up indication is generated if the frequency of the digital signal falls within a frequency range defined by the first threshold frequency and the second threshold frequency, refer to the process performed by the clock counter 301*d* in FIG. 8.

Figure 11:
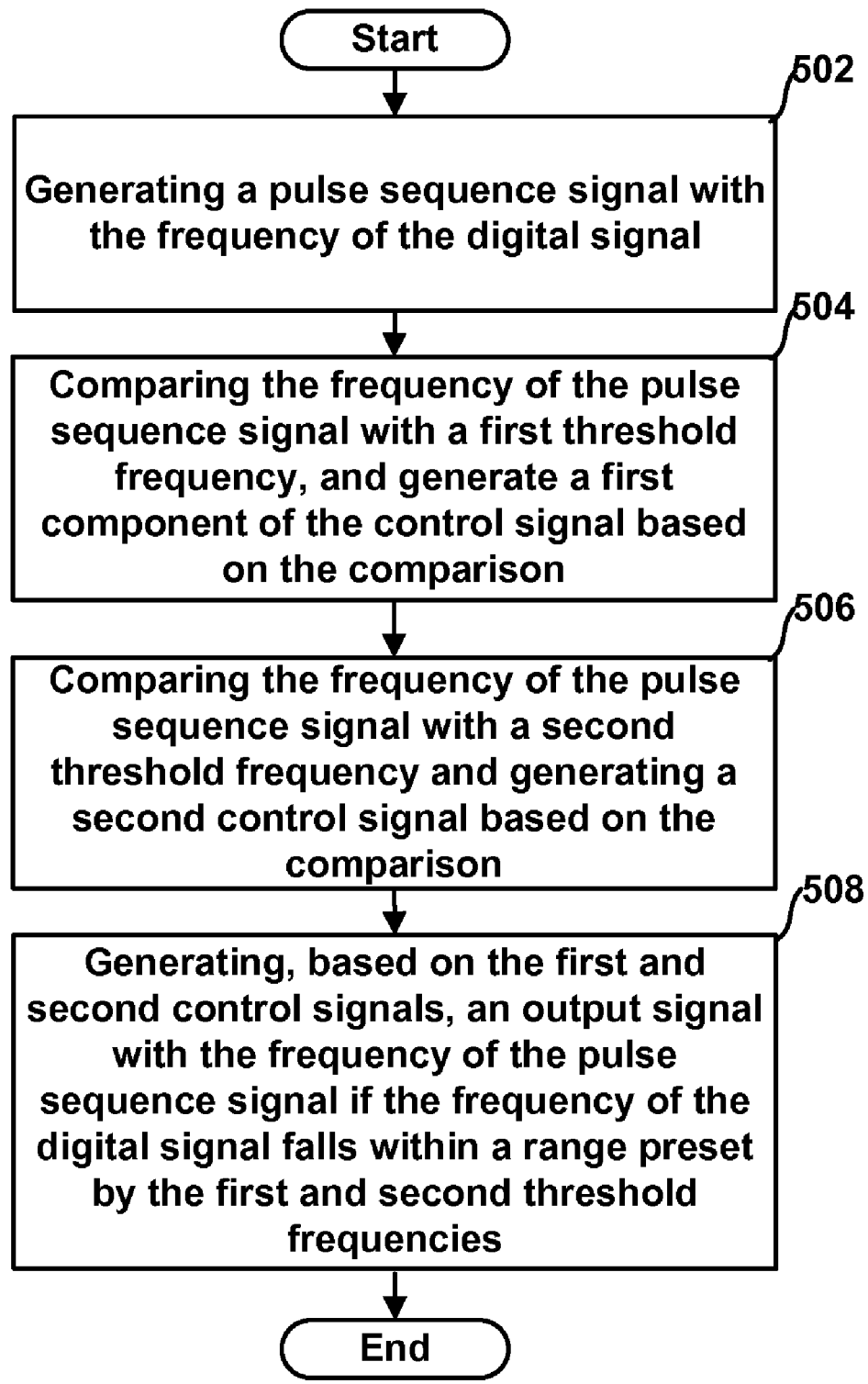
FIG. 11 is a flow chart of a method according to an embodiment of the invention.

FIG. 11 is a flow chart of a method 500 for frequency selective filtering according to one embodiment of the invention. Steps 502-506 are as the same as steps 402-406. In step 508, only if the frequency of the digital signal falls within a defined frequency range, an output signal sharing the same frequency with the digital signal will be generated using the first control signal and the second control signal.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A wake-up circuit, comprising:
   a control signal generation circuit, comprising,
      a pulse generator configured to receive a digital signal and generate a pulse sequence signal with a frequency of the digital signal; a first comparison circuit and a second comparison circuit both coupled to an output end of the pulse generator and configured to receive the pulse sequence signal; the first comparison circuit is configured to compare the frequency of the pulse sequence signal with a first threshold frequency and generate a first control signal based on the comparison; the second comparison circuit is configured to compare the frequency of the pulse sequence signal with a second threshold frequency and generate a second control signal based on the comparison; and an indication generation circuit configured to use the first control signal and the second control signal to generate a wake-up indication when the frequency of the pulse sequence signal falls within a frequency range defined by the first and second threshold frequencies;

wherein, the first comparison circuit comprises a first p-type MOSFET, a first capacitor and a first load, wherein a gate of the first p-type MOSFET is connected to the output end of the pulse generator, a drain of the first p-type MOSFET is connected to a negative terminal of the first capacitor to form a first common terminal, a source of the first p-type MOSFET is connected to a positive terminal of the first capacitor to form a second common terminal, the first common terminal is connected to one end of the first load and the second common terminal is connected to a positive voltage power source, the other end of the first load is grounded;

the second comparison circuit comprises a second p-type MOSFET, a second capacitor and a second load, wherein a gate of the second p-type MOSFET is connected to an output end of the pulse generator, a drain of the second p-type MOSFET is connected to a negative terminal of the second capacitor to form a third common terminal, a source of the second p-type MOSFET is connected to a positive terminal of the second capacitor to form a fourth common terminal, the third common terminal is connected to one end of the second load and the fourth common terminal is connected to the positive voltage power source, the other end of the second load is grounded.

2. The wake-up circuit of claim 1, wherein:

an RC time constant of the first capacitor under the action of the first load is reciprocal of the first threshold frequency; and an RC time constant of the second capacitor under the action of the second load is reciprocal of the second threshold frequency.

3. The wake-up circuit of claim 1, wherein:

the first comparison circuit further comprises a first inverter and a second inverter, an input end of the first inverter is connected to the first common terminal, an output end of the first inverter is connected to an input end of the second inverter, the first control signal is outputted by the second inverter;

the second comparison circuit further comprises a third inverter and a fourth inverter, an input end of the third inverter is connected to the third common terminal, an output end of the third inverter is connected to an input end of the fourth inverter, the second control signal is outputted by the fourth inverter.

4. The wake-up circuit of claim 1, wherein the indication generation circuit comprises a clock counter with a clock signal input end connected to an output end of the first comparison circuit and configured to receive the first control signal and a reset end connected to an output end of the second comparison circuit and configured to receive the second control signal.

5. A filter for digital signals, comprising:

a control signal generation circuit comprising, a pulse generator configured to receive a digital signal and generate a pulse sequence signal with a frequency of the digital signal; a first comparison circuit and a second comparison circuit both coupled to an output end of the pulse generator and configured to receive the pulse sequence signal; the first comparison circuit is configured to compare the frequency of the pulse sequence signal with a first threshold frequency and generate a first control signal based on the comparison; the second comparison circuit is configured to compare the frequency of the pulse sequence signal with a second threshold frequency and generate a second control signal based on the comparison; and a regeneration circuit configured to, based on the first control signal and the second control signal, generate an output signal with the frequency of the digital signal if the frequency of the digital signal falls within a frequency range defined by the first and second threshold frequencies;

wherein, the first comparison circuit comprises a first p-type MOSFET, a first capacitor and a first load, wherein a gate of the first p-type MOSFET is connected to the output end of the pulse generator, a drain of the first p-type MOSFET is connected to a negative terminal of the first capacitor to form a first common terminal, a source of the first p-type MOSFET is connected to a positive terminal of the first capacitor to form a second common terminal, the first common terminal is connected to one end of the first load and the second common terminal is connected to a positive voltage power source, the other end of the first load is grounded;

the second comparison circuit comprises a second p-type MOSFET, a second capacitor and a second load, wherein a gate of the second p-type MOSFET is connected to the output end of the pulse generator, a drain of the second p-type MOSFET is connected to a negative terminal of the second capacitor to form a third common terminal, a source of the second p-type MOSFET is connected to a positive terminal of the second capacitor to form a fourth common terminal, the third common terminal is connected to one end of the second load and the fourth common terminal is connected to the positive voltage power supply, the other end of the second load is grounded.

6. The filter of claim 5, wherein:

an RC time constant of the first capacitor under the action of the first load is reciprocal of the first threshold frequency; and an RC time constant of the second capacitor under the action of the second load is reciprocal of the second threshold frequency.

7. A filter for digital signals, comprising:

a control signal generation circuit comprising, a pulse generator configured to receive a digital signal and generate a pulse sequence signal with a frequency of the digital signal; a first comparison circuit and a second comparison circuit both coupled to an output end of the pulse generator and configured to receive the pulse sequence signal; the first comparison circuit is configured to compare the frequency of the pulse sequence signal with a first threshold frequency and generate a first control signal based on the comparison; the second comparison circuit is configured to compare the frequency of the pulse sequence signal with a second threshold frequency and generate a second control signal based on the comparison; and a regeneration circuit configured to, based on the first control signal and the second control signal, generate an output signal with the frequency of the digital signal if the frequency of the digital signal falls within a frequency range defined by the first and second threshold frequencies;

wherein,
the first comparison circuit further comprises a first inverter and a second inverter, an input end of the first inverter is connected to the first common terminal, an output end of the first inverter is connected to an input end of the second inverter, the first control signal is outputted by the second inverter;

the second comparison circuit further comprises a third inverter and a fourth inverter, an input end of the third inverter is connected to the third common terminal, an output end of the third inverter is connected to an input end of the fourth inverter, the second control signal is outputted by the fourth inverter.

8. A filter for digital signals, comprising:
a control signal generation circuit comprising,
a pulse generator configured to receive a digital signal and generate a pulse sequence signal with a frequency of the digital signal; a first comparison circuit and a second comparison circuit both coupled to an output end of the pulse generator and configured to receive the pulse sequence signal; the first comparison circuit is configured to compare the frequency of the pulse sequence signal with a first threshold frequency and generate a first control signal based on the comparison; the second comparison circuit is configured to compare the frequency of the pulse sequence signal with a second threshold frequency and generate a second control signal based on the comparison; and
a regeneration circuit configured to, based on the first control signal and the second control signal, generate an output signal with the frequency of the digital signal if the frequency of the digital signal falls within a frequency range defined by the first and second threshold frequencies;

wherein the regeneration circuit comprises a first D-type flip-flop, a second D-type flip-flop and an AND gate, the first and second D-type flip-flops respectively comprise a D input end, a clock signal input end, a reset end and an output end, the D input end of the first D-type flip-flop is connected to the positive voltage power supply, the clock signal input end of the first D-type flip-flop is connected to an output end of the first comparison circuit and configured to receive the first control signal, the reset end of the first D-type flip-flop is connected to the output end of the second comparison circuit and configured to receive the second control signal, the output end of the first D-type flip-flop is connected to the D input end of the second D-type flip-flop, and the clock signal input end of the second D-type flip-flop is connected to the output end of the first comparison circuit and configured to receive the first control signal, the reset end of the second D-type flip-flop is connected to the output end of the second comparison circuit and configured to receive the second control signal, the output end of the second D-type flip-flop is connected to an input end of the AND gate, another input end of the AND gate is connected to the output end of the first comparison circuit and configured to receive the first control signal, an output end of the AND gate is taken as an output end of the regeneration circuit.

9. A method in a wake-up circuit, comprising:
a. generating a pulse sequence signal with a frequency of a digital signal;
b. comparing the frequency of the pulse sequence signal with a first threshold frequency, and generating a first control signal based on the comparison;
c. comparing the frequency of the pulse sequence signal with a second threshold frequency, and generating a second control signal based on the comparison;
d. generating, based on the first control signal and the second control signal, a wake-up indication if the frequency of the pulse sequence signal falls within a frequency range defined by the first and second threshold frequencies;

wherein the step b further comprises,
comparing the frequency of the pulse sequence signal with the first threshold frequency and generating the first control signal based on the comparison by using a first comparison circuit, the first comparison circuit including,
a first p-type MOSFET, a first capacitor and a first load, wherein a gate of the first p-type MOSFET is connected to the output end of the pulse generator, a drain of the first p-type MOSFET is connected to a negative terminal of the first capacitor to form a first common terminal, a source of the first p-type MOSFET is connected to a positive terminal of the first capacitor to form a second common terminal, the first common terminal is connected to one end of the first load and the second common terminal is connected to a positive voltage power source, the other end of the first load is grounded;

the step c further comprises,
comparing the frequency of the pulse sequence signal with the second threshold frequency and generating the second control signal based on the comparison by using a second comparison circuit, the second comparison circuit including,
a second p-type MOSFET, a second capacitor and a second load, wherein a gate of the second p-type MOSFET is connected to an output end of the pulse generator, a drain of the second p-type MOSFET is connected to a negative terminal of the second capacitor to form a third common terminal, a source of the second p-type MOSFET is connected to a positive terminal of the second capacitor to form a fourth common terminal, the third common terminal is connected to one end of the second load and the fourth common terminal is connected to the positive voltage power source, the other end of the second load is grounded.

10. The method of claim 9, wherein,
an RC time constant of the first capacitor under the action of the first load is reciprocal of the first threshold frequency; and
an RC time constant of the second capacitor under the action of the second load is reciprocal of the second threshold frequency.

11. The method of claim 9, wherein,
the first comparison circuit further comprises a first inverter and a second inverter, an input end of the first inverter is connected to the first common terminal, an output end of the first inverter is connected to an input end of the second inverter, the first control signal is outputted by the second inverter;

the second comparison circuit further comprises a third inverter and a fourth inverter, an input end of the third inverter is connected to the third common terminal, an output end of the third inverter is connected to an input end of the fourth inverter, the second control signal is outputted by the fourth inverter.

12. The method of claim 9, wherein the step d further comprises:

generating, based on the first control signal and the second control signal and by using an indication generation circuit, a wake-up indication if the frequency of the pulse sequence signal falls within a frequency range defined by the first and second threshold frequencies, wherein the indication generation circuit comprises a clock counter with a clock signal input end connected to an output end of the first comparison circuit and configured to receive the first control signal and a reset end connected to an output end of the second comparison circuit and configured to receive the second control signal.

13. A method, comprising:

e. generating a pulse sequence signal with a frequency of a digital signal;

f. comparing the frequency of the pulse sequence signal with a first threshold frequency to generate a first control signal;

g. comparing the frequency of the pulse sequence signal with a second threshold frequency to generate a second control signal;

h. generating, based on the first control signal and the second control signal, an output signal with the frequency of the pulse sequence signal if the frequency of the pulse sequence signal falls within a frequency range defined by the first and second threshold frequencies.

wherein the step f further comprises, comparing the frequency of the pulse sequence signal with a first threshold frequency to generate a first control signal by using a first comparison circuit, wherein the first comparison circuit comprises a first p-type MOSFET, a first capacitor and a first load, wherein a gate of the first p-type MOSFET is connected to the output end of the pulse generator, a drain of the first p-type MOSFET is connected to a negative terminal of the first capacitor to form a first common terminal, a source of the first p-type MOSFET is connected to a positive terminal of the first capacitor to form a second common terminal, the first common terminal is connected to one end of the first load and the second common terminal is connected to a positive voltage power source, the other end of the first load is grounded;

the step g further comprises, comparing the frequency of the pulse sequence signal with a second threshold frequency to generate a second control signal by using a second comparison circuit, wherein the second comparison circuit comprises a second p-type MOSFET, a second capacitor and a second load, wherein a gate of the second p-type MOSFET is connected to the output end of the pulse generator, a drain of the second p-type MOSFET is connected to a negative terminal of the second capacitor to form a third common terminal, a source of the second p-type MOSFET is connected to a positive terminal of the second capacitor to form a fourth common terminal, the third common terminal is connected to one end of the second load and the fourth common terminal is connected to the positive voltage power supply, the other end of the second load is grounded.

14. The method of claim 13, wherein:

an RC time constant of the first capacitor under the action of the first load is reciprocal of the first threshold frequency; and an RC time constant of the second capacitor under the action of the second load is reciprocal of the second threshold frequency.

15. A method, comprising:

e. generating a pulse sequence signal with a frequency of a digital signal;

f. comparing the frequency of the pulse sequence signal with a first threshold frequency to generate a first control signal;

g. comparing the frequency of the pulse sequence signal with a second threshold frequency to generate a second control signal;

h. generating, based on the first control signal and the second control signal, an output signal with the frequency of the pulse sequence signal if the frequency of the pulse sequence signal falls within a frequency range defined by the first and second threshold frequencies;

wherein, the first comparison circuit further comprises a first inverter and a second inverter, an input end of the first inverter is connected to the first common terminal, an output end of the first inverter is connected to an input end of the second inverter, the first control signal is outputted by the second inverter;

the second comparison circuit further comprises a third inverter and a fourth inverter, an input end of the third inverter is connected to the third common terminal, an output end of the third inverter is connected to an input end of the fourth inverter, the second control signal is outputted by the fourth inverter.

16. A method, comprising:

e. generating a pulse sequence signal with a frequency of a digital signal;

f. comparing the frequency of the pulse sequence signal with a first threshold frequency to generate a first control signal;

g. comparing the frequency of the pulse sequence signal with a second threshold frequency to generate a second control signal;

h. generating, based on the first control signal and the second control signal, an output signal with the frequency of the pulse sequence signal if the frequency of the pulse sequence signal falls within a frequency range defined by the first and second threshold frequencies;

wherein the step h further comprises, generating, based on the first control signal and the second control signal and by using a regeneration circuit, an output signal with the frequency of the pulse sequence signal if the frequency of the pulse sequence signal falls within a frequency range defined by the first and second threshold frequencies, wherein the regeneration circuit comprises a first D-type flip-flop, a second D-type flip-flop and an AND gate, the first and second D-type flip-flops respectively comprise a D input end, a clock signal input end, a reset end and an output end, the D input end of the first D-type flip-flop is connected to the positive voltage power supply, the clock signal input end of the first D-type flip-flop is connected to an output end of the first comparison circuit and configured to receive the first control signal, the reset end of the first D-type flip-flop is connected to the output end of the second comparison circuit and configured to receive the second control signal, the output end of the first D-type flip-flop is connected to the D input end of the second D-type flip-flop, and the clock signal input end of the second D-type flip-flop is connected to the output end of the first comparison circuit and configured to receive the first control signal, the reset end of the second D-type flip-flop is connected to the output end of the second comparison circuit and configured to receive the second control signal, the output end of the second D-type flip-flop is connected to an input end of the AND gate;

another input end of the AND gate is connected to the output end of the first comparison circuit and configured to receive the first control signal, an output end of the AND gate is taken as an output end of the regeneration circuit.

\* \* \* \* \*